United States Patent
Yang et al.

(10) Patent No.: US 12,092,406 B2
(45) Date of Patent: Sep. 17, 2024

(54) TWO-PHASE IMMERSION-TYPE HEAT DISSIPATION STRUCTURE HAVING NON-VERTICAL FINS

(71) Applicant: AMULAIRE THERMAL TECHNOLOGY, INC., New Taipei (TW)

(72) Inventors: Ching-Ming Yang, New Taipei (TW); Chun-Te Wu, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 219 days.

(21) Appl. No.: 17/978,944

(22) Filed: Nov. 1, 2022

(65) Prior Publication Data
US 2024/0142180 A1  May 2, 2024

(51) Int. Cl.
*F28F 3/02* (2006.01)
*F28D 15/02* (2006.01)

(52) U.S. Cl.
CPC ........... *F28F 3/02* (2013.01); *F28D 15/02* (2013.01); *F28F 3/025* (2013.01); *F28F 3/027* (2013.01); *F28F 2215/04* (2013.01)

(58) Field of Classification Search
CPC .... F28F 3/02; F28F 3/025; F28F 3/027; F28F 2215/04; F28D 15/02
USPC ..................................... 165/104.21
See application file for complete search history.

(56) References Cited

U.S. PATENT DOCUMENTS

| | | | | |
|---|---|---|---|---|
| D426,196 S | * | 6/2000 | Lee | .............................. D13/179 |
| 6,675,885 B2 | * | 1/2004 | Kuo | .................... H01L 23/3672 |
| | | | | 174/16.3 |
| 7,355,148 B2 | * | 4/2008 | Boussier | ................. F24H 3/002 |
| | | | | 219/544 |
| 2010/0157541 A1 | * | 6/2010 | Zhu | ....................... H01L 23/433 |
| | | | | 361/710 |

* cited by examiner

*Primary Examiner* — Joel M Attey
(74) *Attorney, Agent, or Firm* — Li & Cai Intellectual Property Office

(57) ABSTRACT

A two-phase immersion-type heat dissipation structure is provided. The two-phase immersion-type heat dissipation structure includes a heat dissipation substrate and a plurality of non-vertical fins. The heat dissipation substrate has a fin surface and a non-fin surface that face away from each other. The non-fin surface is configured to be in contact with a heating element immersed in a two-phase coolant. The fin surface is connected with the non-vertical fins, a cross-sectional contour of one of the non-vertical fins has a top end point and a bottom end point connected with the fin surface, and the top and bottom end points are opposite to each other. A length of a cross-sectional contour line defined from the top end point to the bottom end point is greater than a perpendicular line length of a perpendicular line defined from the top end point to the fin surface.

10 Claims, 2 Drawing Sheets

TWO-PHASE IMMERSION-TYPE HEAT DISSIPATION STRUCTURE HAVING NON-VERTICAL FINS

FIELD OF THE DISCLOSURE

The present disclosure relates to a heat dissipation structure, and more particularly to a two-phase immersion-type heat dissipation structure having non-vertical fins.

BACKGROUND OF THE DISCLOSURE

An immersion cooling technology is to directly immerse heat producing elements (such as servers and disk arrays) into a coolant that is non-conductive, and heat generated from operation of the heat producing elements is removed through an endothermic gasification process of the coolant. Therefore, how to dissipate heat more effectively through the immersion cooling technology has long been an issue to be addressed in the industry.

SUMMARY OF THE DISCLOSURE

In response to the above-referenced technical inadequacy, the present disclosure provides a two-phase immersion-type heat dissipation structure having non-vertical fins.

In one aspect, the present disclosure provides a two-phase immersion-type heat dissipation structure. The two-phase immersion-type heat dissipation structure includes a heat dissipation substrate, and a plurality of non-vertical fins. The heat dissipation substrate has a fin surface and a non-fin surface that face away from each other. The non-fin surface is configured to be in contact with a heating element immersed in a two-phase coolant. The fin surface is connected with the plurality of non-vertical fins, a cross-sectional contour of one of the non-vertical fins has a top end point and a bottom end point that is connected with the fin surface, and the top end point and the bottom end point are opposite to each other. A length of a cross-sectional contour line defined from the top end point to the bottom end point is greater than a perpendicular line length of a perpendicular line defined from the top end point to the fin surface.

In certain embodiments, the plurality of non-vertical fins are made of copper, copper alloy, or aluminum alloy.

In certain embodiments, the plurality of non-vertical fins are pin-fins or plate-fins.

In certain embodiments, the cross-sectional contour of one of the plurality of non-vertical fins is arc-shaped.

In certain embodiments, the cross-sectional contour of each of the plurality of non-vertical fins is arc-shaped, and is concaved in a same direction.

In certain embodiments, the plurality of non-vertical fins are arc-shaped fins formed by a process of applying pressure onto vertical fins.

In certain embodiments, the cross-sectional contour of one of the plurality of non-vertical fins has a bent shape.

In certain embodiments, the cross-sectional contour of each of the plurality of non-vertical fins has a bent shape, and is concaved in a same direction.

In certain embodiments, the plurality of non-vertical fins are bent-shaped fins formed by a process of applying pressure onto vertical fins.

In certain embodiments, the plurality of non-vertical fins are bent-shaped fins formed by multiple bending processes, and linear sections of each of the plurality of non-vertical fins extend along an inclined upward direction.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
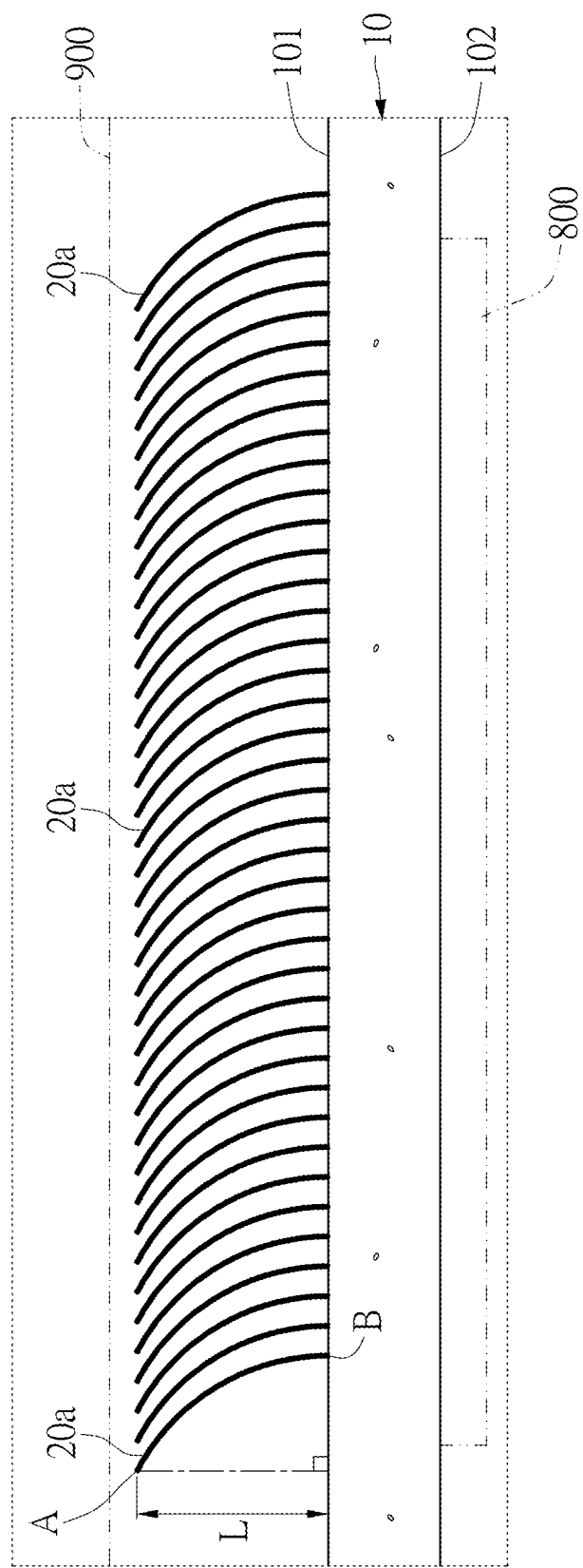
FIG. 1 is a schematic side view of a two-phase immersion-type heat dissipation structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, a first embodiment of the present disclosure provides a two-phase immersion-type heat dissipation structure having non-vertical fins for contacting a heating element immersed in a two-phase coolant. As shown in FIG. 1, the two-phase immersion-type heat dissipation structure according to the first embodiment of the present disclosure includes a heat dissipation substrate 10, and a plurality of non-vertical fins 20a.

In this embodiment, the heat dissipation substrate 10 can be made of a material that has high thermal conductivity, such as aluminum, copper, aluminum alloy, or copper alloy.

The heat dissipation substrate 10 can be a non-porous heat dissipation material or a porous heat dissipation material. Preferably, the heat dissipation substrate 10 can be a porous metal heat dissipation plate immersed in a two-phase coolant (e.g., FLUORINERT™) and has a porosity of greater than 8%, so that an amount of bubbles generated is increased and an immersion heat dissipation effect is improved.

In this embodiment, the heat dissipation substrate 10 has a fin surface 101 and a non-fin surface 102 that face away from each other. The non-fin surface 102 of the heat dissipation substrate 10 is configured to be in contact (e.g., in a direct contact, or in an indirect contact via an intermediate layer) with a heating element 800 (such as a server motherboard) immersed in a two-phase coolant 900. The fin surface 101 of the heat dissipation substrate 10 is connected with the plurality of non-vertical fins 20a, and the heat dissipation substrate 10 and the non-vertical fins 20a can be integrally connected with each other by metal injection molding or skiving. The heat dissipation substrate 10 and the non-vertical fins 20a can also be connected by soldering. Moreover, the non-vertical fins 20a can be made by copper, copper alloy, or aluminum alloy, and can be pin-fins or plate-fins.

Furthermore, a cross-sectional contour of one of the non-vertical fins 20a has a top end point A and a bottom end point B that is connected with the fin surface 101, and the top end point A and the bottom end point B are opposite to each other. A length of a cross-sectional contour line defined from the top end point A to the bottom end point B along the one of the non-vertical fins 20a is greater than a perpendicular line length L of a perpendicular line defined from the top end point A to the fin surface 101. Therefore, in comparison to an imaginary vertical fin defined by the perpendicular line length L, when a vertical height of a fin is limited (e.g., in a limited space, a plurality of heat dissipation substrates are respectively in contact with a plurality of server motherboards and are arranged in a stack with small distances therebetween), the non-vertical fins 20a of the present embodiment can have more surface area than the imaginary vertical fin for bubbles to carry out nucleate boiling, so as to further improve an immersion-type heat dissipation effect.

Moreover, in this embodiment, a cross-section of one of the non-vertical fins 20a is arc-shaped, and a cross-sectional contour of the one of the non-vertical fins 20a is an arc-shaped cross-sectional contour; therefore, the length of the cross-sectional contour of the one of the non-vertical fins 20a is a length of an arc-shaped cross-sectional contour. In addition, in this embodiment, a cross-sectional contour of each of the plurality of non-vertical fins 20a is arc-shaped, and is concaved in a same direction. In detail, in this embodiment, the cross-sectional contour of each of the plurality of non-vertical fins 20a is arc-shaped, and is concaved in a rightward direction; naturally, the cross-sectional contour of each of the plurality of non-vertical fins 20a can be arc-shaped, and concaved in a leftward direction.

In this embodiment, the plurality of non-vertical fins 20a can have arc-shaped cross-sectional contours by having a downward force applied to the vertical fins from above the vertical fins, or by having a sideway force applied to the vertical fins from one side of the vertical fins, so that shapes of the vertical fins are transformed into an arc shape. In other words, in this embodiment, the plurality of non-vertical fins 20a can be arc-shaped fins that are formed by a process of applying pressure onto vertical fins.

Second Embodiment

Figure 2:
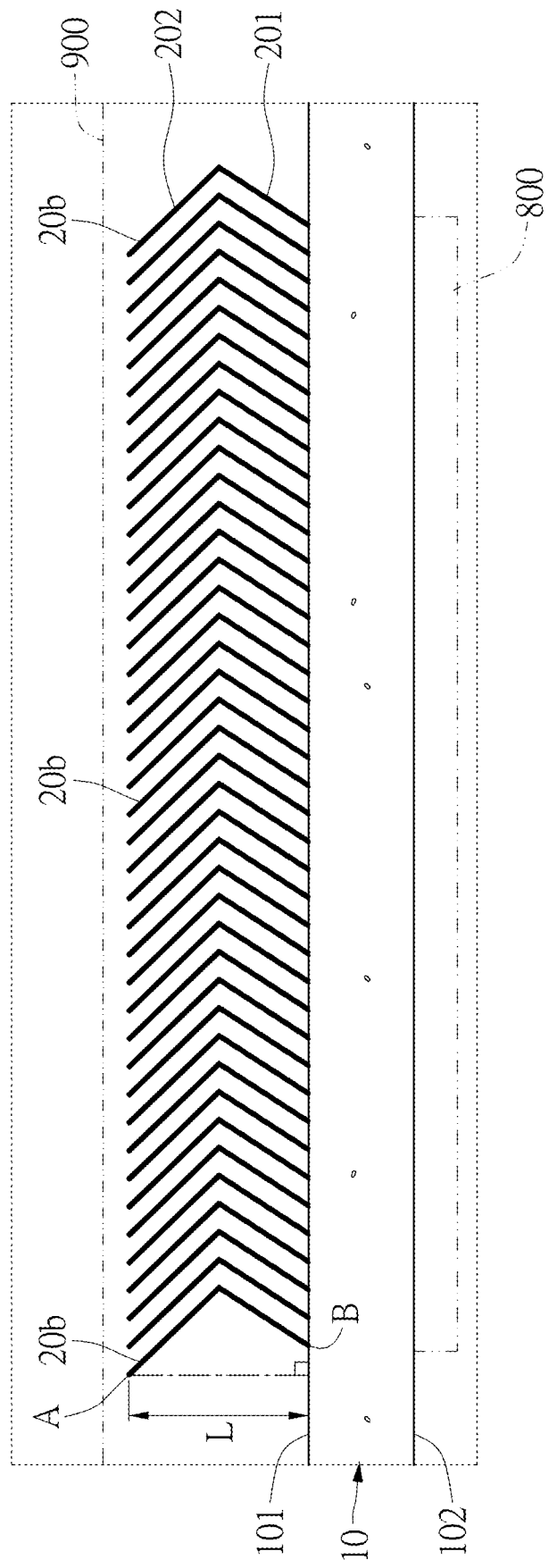
FIG. 2 is a schematic side view of a two-phase immersion-type heat dissipation structure according to a second embodiment of the present disclosure.

Referring to FIG. 2, a second embodiment of the present disclosure is substantially the same as the first embodiment, and the difference therebetween is described as follows.

In this embodiment, a cross-sectional contour of one of the non-vertical fins 20b has a top end point A and a bottom end point B that is connected with the fin surface 101, and the top end point A and the bottom end point B are opposite to each other. A length of a cross-sectional contour line defined from the top end point A to the bottom end point B along the one of the non-vertical fins 20b is greater than a perpendicular line length L of a perpendicular line defined from the top end point A to the fin surface 101. Moreover, in this embodiment, a cross-section of one of the non-vertical fins 20b has a bent shape, and a cross-sectional contour of the one of the non-vertical fins 20b is a bent-shaped cross-sectional contour; therefore, the length of the cross-sectional contour of the one of the non-vertical fins 20b is a length of a bent-shaped cross-sectional contour. In addition, in this embodiment, a cross-sectional contour of each of the plurality of non-vertical fins 20b has a bent shape, and concaved in a same direction. In detail, in this embodiment, the cross-sectional contour of each of the plurality of non-vertical fins 20b has a bent shape, and concaved in a rightward direction, naturally, the cross-sectional contour of each of the plurality of non-vertical fins 20b can also be bent-shaped, and concaved in a leftward direction.

In this embodiment, the plurality of non-vertical fins 20b can have bent-shaped cross-sectional contours by having a downward force applied to the vertical fins from above the vertical fins, or by having a sideways force applied to the vertical fins from one side of the vertical fins, so that shapes of the vertical fins are transformed into a shape that is bent in multiple angles. In other words, in this embodiment, the plurality of non-vertical fins 20b can be bent-shaped fins being bent to have multiple sections that have multiple angles and are formed by a process of applying pressure onto vertical fins. In addition, the plurality of non-vertical fins 20b can be bent-shaped fins formed by multiple bending processes, and linear sections of each of the plurality of non-vertical fins extend along an inclined upward direction.

In detail, each of the plurality of non-vertical fins 20b of the present embodiment can have a first linear section 201 and a second linear section 202 that are integrally connected, the first linear section 201 extends along an upper rightward direction, and the second linear section 202 extends along an upper leftward direction.

Beneficial Effects of the Embodiments

In conclusion, in the two-phase immersion-type heat dissipation structure having non-vertical fins, by technical features of "a two-phase immersion-type heat dissipation structure including a plurality of non-vertical fins," "a heat dissipation substrate having a fin surface and a non-fin surface that face away from each other, the non-fin surface being configured to be in contact with a heating element immersed in a two-phase coolant, and the fin surface being connected with the plurality of non-vertical fins," and "a cross-sectional contour of one of the non-vertical fins having a top end point and a bottom end point that is connected with the fin surface, the top end point and the bottom end point being opposite to each other, and a length of a cross-sectional contour line defined from the top end point to the bottom end point being greater than a perpendicular line length of a perpendicular line defined from the top end point to the fin surface," an overall immersion-type heat dissipation effect is improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A two-phase immersion-type heat dissipation structure, comprising:
   a heat dissipation substrate having a fin surface and a non-fin surface that face away from each other, wherein the non-fin surface is configured to be in contact with a heating element immersed in a two-phase coolant; and
   a plurality of non-vertical fins, wherein the fin surface is connected with the plurality of non-vertical fins, a cross-sectional contour of one of the non-vertical fins has a top end point and a bottom end point that is connected with the fin surface, and the top end point and the bottom end point are opposite to each other;
   wherein a length of a cross-sectional contour line defined from the top end point to the bottom end point is greater than a perpendicular line length of a perpendicular line defined from the top end point to the fin surface.

2. The two-phase immersion-type heat dissipation structure according to claim 1, wherein the plurality of non-vertical fins are made of copper, copper alloy, or aluminum alloy.

3. The two-phase immersion-type heat dissipation structure according to claim 1, wherein the plurality of non-vertical fins are pin-fins or plate-fins.

4. The two-phase immersion-type heat dissipation structure according to claim 1, wherein the cross-sectional contour of one of the plurality of non-vertical fins is arc-shaped.

5. The two-phase immersion-type heat dissipation structure according to claim 1, wherein the cross-sectional contour of each of the plurality of non-vertical fins is arc-shaped, and concaved in a same direction.

6. The two-phase immersion-type heat dissipation structure according to claim 1, wherein the plurality of non-vertical fins are arc-shaped fins formed by a process of applying pressure onto vertical fins.

7. The two-phase immersion-type heat dissipation structure according to claim 1, wherein the cross-sectional contour of one of the plurality of non-vertical fins has a bent shape.

8. The two-phase immersion-type heat dissipation structure according to claim 1, wherein the cross-sectional contour of each of the plurality of non-vertical fins has a bent shape, and is concaved in a same direction.

9. The two-phase immersion-type heat dissipation structure according to claim 1, wherein the plurality of non-vertical fins are bent-shaped fins formed by a process of applying pressure onto vertical fins.

10. The two-phase immersion-type heat dissipation structure according to claim 1, wherein the plurality of non-vertical fins are bent-shaped fins formed by multiple bending processes, and linear sections of each of the plurality of non-vertical fins extend along an inclined upward direction.

* * * * *